United States Patent
Mochizuki et al.

(10) Patent No.: US 6,881,639 B2
(45) Date of Patent: Apr. 19, 2005

(54) METHOD OF MANUFACTURING SEMICONDUCTOR DEVICE

(75) Inventors: Kazuhiro Mochizuki, Tokyo (JP); Kiyoshi Ouchi, Kodaira (JP); Tomonori Tanoue, Machida (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/372,774

(22) Filed: Feb. 26, 2003

(65) Prior Publication Data

US 2003/0186509 A1 Oct. 2, 2003

(30) Foreign Application Priority Data

Mar. 26, 2002 (JP) ........................................ 2002-085492

(51) Int. Cl.$^7$ ............................................. H01L 21/331
(52) U.S. Cl. ........................ 438/312; 438/354; 438/369; 257/197; 257/583; 257/586; 257/591
(58) Field of Search ................................. 438/235, 312, 438/320, 342, 369, 525, 354; 257/197, 373, 583, 586, E29.03, E29.114, E29.185

(56) References Cited

U.S. PATENT DOCUMENTS

| | | | | |
|---|---|---|---|---|
| 5,329,145 A | * | 7/1994 | Nakagawa | ................... 257/198 |
| 6,147,371 A | * | 11/2000 | Tanaka | ........................ 257/197 |
| 2002/0190273 A1 | * | 12/2002 | Delage et al. | ............... 257/197 |
| 2003/0042503 A1 | * | 3/2003 | Hartmann | .................... 257/197 |

* cited by examiner

Primary Examiner—George Fourson
Assistant Examiner—Julio J. Maldonado
(74) Attorney, Agent, or Firm—Antonelli, Terry, Stout & Kraus, LLP

(57) ABSTRACT

The present invention provides a method of manufacturing semiconductor devices, by which InGaAs-base C-top HBTs are manufactured at low cost. Helium ions with a smaller radius are implanted into a p-type InGaAs layer (in external base regions) not covered with a lamination consisting of an undoped InGaAs spacer layer, n-type InP collector layer, n-type InGaAs cap layer, and collector electrode from a direction vertical to the surface of the external base layer or within an angle of 3 degrees off the vertical. In consequence, the p-type InGaAs in the external base regions remains p-type conductive and low resistive and the n-type InAlAs layer in the external emitter regions can be made highly resistive. By this method, InGaAs-base C-top HBTs can be fabricated on a smaller chip at low cost without increase of the number of processes.

8 Claims, 4 Drawing Sheets

BACKGROUND

BACKGROUND

METHOD OF MANUFACTURING SEMICONDUCTOR DEVICE

BACKGROUND OF THE INVENTION

1. Field of the Invention

The present invention relates to semiconductor devices using Collector-top Heterojunction Bipolar Transistors (hereinafter referred to as C-top HBTs) in which an InGaAs base layer is employed and a collector layer is formed on the top of the surface of the InGaAs base layer. In particular, the invention relates to a method of manufacturing semiconductor devices which are ideal for power amplifiers for use in mobile communication tools for which high electric power conversion efficiency is required.

2. Description of the Related Art

Along with rapid growth of mobile communication equipment, study and development of power amplifiers for use in such communication equipment have lately been conducted actively. In order to enhance the electric power conversion efficiency of a power amplifier, it is necessary to enhance the electric power conversion efficiency of the HBTs employed in the power amplifier. For this purpose, it is effective to use HBTs employing a base layer of InGaAs (the mole fraction of InAs is 0.5) which exhibits excellent high-frequency characteristics (which will be referred to as InGaAs-base HBTs hereinafter) instead of HBTs employing a GaAs base layer which have heretofore been used commonly (which will be referred to as GaAs-base HBTs hereinafter).

Information about application of the InGaAs-base HBTs to amplifiers making a high power output is disclosed in 2001 International Conference on Indium Phosphide and Related Materials, Conference Proceedings (May 14–18, 2001, Nara), pp. 501–504.

Although the InGaAs-base HBTs have excellent high-frequency characteristics, the size of the InP substrate which lattice matches with InGaAs (the mole fraction of InAs is 0.5) is restricted to a maximum of four inches, and, therefore, the unit cost of these transistors is about three times as high as HBTs fabricated on a six-inch GaAs substrate. Because of the cost consideration, it has been difficult to apply the InGaAs-base HBTs as semiconductor devices for power amplifiers for use in mobile communication tools for which low price is required.

With respect to this problem, the chip size can be reduced by using a C-top HBT whose configuration is shown in FIG. 1 as will be described below. This C-top HBT is expected to provide a solution to the cost problem and realize a power amplifier that has good high-frequency characteristics and an excellent electric power conversion efficiency. In FIG. 1, reference numeral 1 denotes a semiconductor substrate, 2 denotes a sub-emitter layer, 3 denotes an emitter layer, 4 denotes a base layer, 5 denotes a spacer, 6 denotes a collector layer, 7 denotes a cap layer, 8 denotes a collector electrode, 9 denotes a base electrode, 10 denotes an emitter electrode, 11 denotes an external base layer, 12 denotes a high resistance external emitter.

For emitter-top HBTs (hereinafter referred to as E-top HBTs) configured by prior art, which have an emitter layer on the top of the surface of the base layer, heat does not dissipate well, and about 45μm pitches between the transistors must be provided in a multi-finger configuration of these HBTs for use in power amplifiers.

On the other hand, for C-top HBTs in which an emitter layer is formed at the bottom to make a ground plane, heat generated during the operation of the transistors can dissipate to under the substrate by providing the opening for heat dissipation which also makes the ground plane directly under the substrate of the transistors. Therefore, the C-top HBTs are of good heat dissipation and need not have an emitter electrode at the top of the surface of the base layer, and the pitches between the transistors in a multi-finger configuration of these HBTs can be reduced down to about 15 μm (see FIG. 2).

Accordingly, by using C-top HBTs, the chip size of monolithic microwave integrated circuits (MMICs) can be downsized to one third the size of the corresponding circuits using E-top HBTs. In consequence, high-efficiency power amplifiers can be produced even with InGaAs-base HBTs using InP substrates at almost the same production cost as with GaAs-base HBTs using GaAs substrates.

Information about the C-top HBTs is disclosed in, for example, IEEE Transactions on Electron Devices, Vol. 47, No. 12, Dec. 2000, pp. 2277–2283.

However, a significant problem of InGaAs-base HBTs was posed in relation to ion implantation which is an essential process for fabricating C-top HBTs. Ion implantation into the p-type InGaAs base layer causes a phenomenon that the InGaAs base layer changes to n-type or its resistance becomes higher. This phenomenon makes the ohmic contact of the base electrode inoperative and, consequently, made the transistor impossible to operate as a C-top HBT. Then, an attempt to implant p-type impurities such as berylium (Be) into the base layer again to turn it to p-type was proposed. However, this method of re-implantation of p-type impurities such as Be into the base layer cannot be applied for the following reason. In addition to higher cost by the increased number of processes, annealing at 800° C. or higher is required to activate the impurities and this has an adverse effect on the characteristics of the transistor with the InGaAs base layer because InGaAs changes its properties when exposed to temperature of 500° C. or higher.

Therefore, it has heretofore been difficult to manufacture InGaAs-base C-top HBTs having good high-frequency characteristics at low cost.

SUMMARY OF THE INVENTION

It is an object of the present invention to provide a method of manufacturing semiconductor devices by which semiconductor devices using InGaAs-base HBTs can be manufactured at low cost without degrading their good high-frequency characteristics.

The foregoing object is achieved by implanting helium (He) ions with a smaller radius into an external base layer in regions not covered with a collector layer from a direction vertical to the surface of the external base layer or within an angle of 3 degrees off the vertical axis. In consequence, p-type InGaAs external base regions remain p-type conductive and low resistive and n-type InAlAs external emitter regions can be made highly resistive.

The foregoing object and other objects and advantages of the invention will be more apparent from the following detailed description of illustrative embodiments thereof with reference to the accompanying drawings and the appended claims. In the accompanying drawings, it should be noted that same reference numbers are used to denote same or similar parts of a semiconductor device.

DETAILED DESCRIPTION OF THE PREFERRED EMBODIMENTS

Preferred embodiments of the method of manufacturing semiconductor devices according to the present invention will be described hereinafter with reference to the accompanying drawings.

Embodiment

Before describing a specific preferred embodiment of the invention, the result of ion implantation experiments we made will be described, based on which we determined to use helium (He) ions in the ion implantation process, which is the key point of the invented method of manufacturing semiconductor devices.

Figures 3A, 3B:
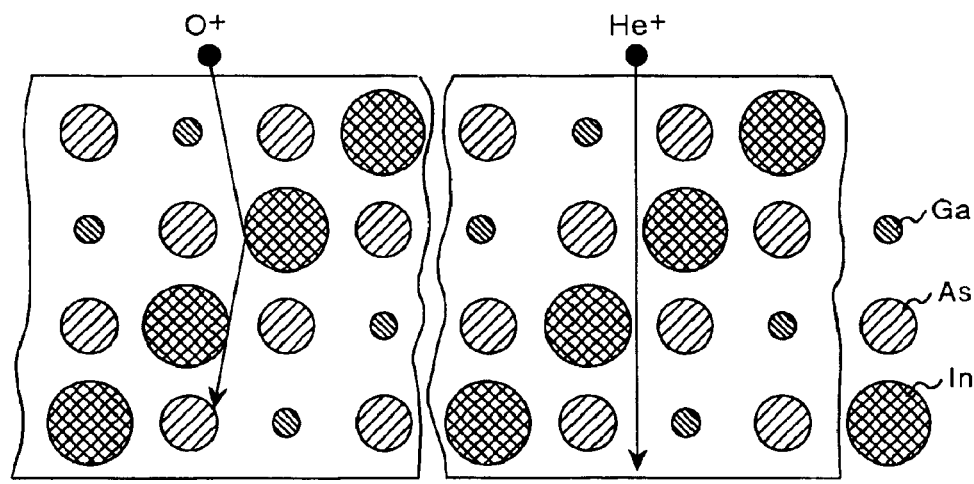
FIGS. 3A and 3B are cross-sectional views of models of transistor structures, which explain the implantation of channeling ions.

In the conventional ion implantation process including ion implantation applied in the process of fabricating C-top HBTs, it has been generally practiced to implant ions into the base layers from a direction tilting at an angle of about 7 degrees off the vertical to the surface in order to enhance the uniformity of the implanted ions, as is shown in FIG. 3(A). Some of the implanted ions collide with atoms constituting semiconducting material in the external emitter regions and generates crystal defects which act as carrier trap centers. As a result, the electrons in parasitic regions (external base and external emitter regions) outside the active regions cannot enter the base layers which are the active regions and a high rate of current amplification is maintained.

This ion implantation method from a direction tilting at an angle of 7 degrees off the vertical to the surface is effective for GaAs-base C-top HBTs having AlGaAs (or InGaP) emitters. This is because of the properties of the constituent substances; that is, the resistance of p-type GaAs is hard to increase by ion implantation, whereas the resistance of n-type AlGaAs (or n-type InGaP) is easy to increase by ion implantation. Conventionally, for example, oxygen ions (O+) have been used as the ions to be implanted.

On the other hand, InGaAs-base HBTs have the above-noted problem that p-type InGaAs changes to n-type or its resistance becomes higher by ion implantation. In order to resolve this problem, the present inventors conducted ion implantation experiments in which we selected He ions with a smaller radius to be implanted and allowed the He ions to channel across the InGaAs external base regions without generating crystal defects there. In alloy semiconductors consisting of a plurality of semiconducting compounds (for example, InGaAs is an alloy semiconductor consisting of two semiconducting compounds, InAs and GaAs), the constituent atoms (for example, In and Ga) are generally thought to exist unevenly throughout a region, not in regular arrangements of the atoms which are found in compound semiconductors. According to a generally acceptable theory, even if implantation of He ions with a smaller radius from a direction vertical to the surface is attempted to allow the He ions to channel across a layer, the He ions would be bound to scatter without channeling across the layer. Thus, it was believed that such approach could not prevent InGaAs from becoming to have higher resistance or changing to n-type by ion implantation. Heretofore, there have been no examples of the attempts to implant the He ions into an InGaAs layer for channeling.

Figure 4:
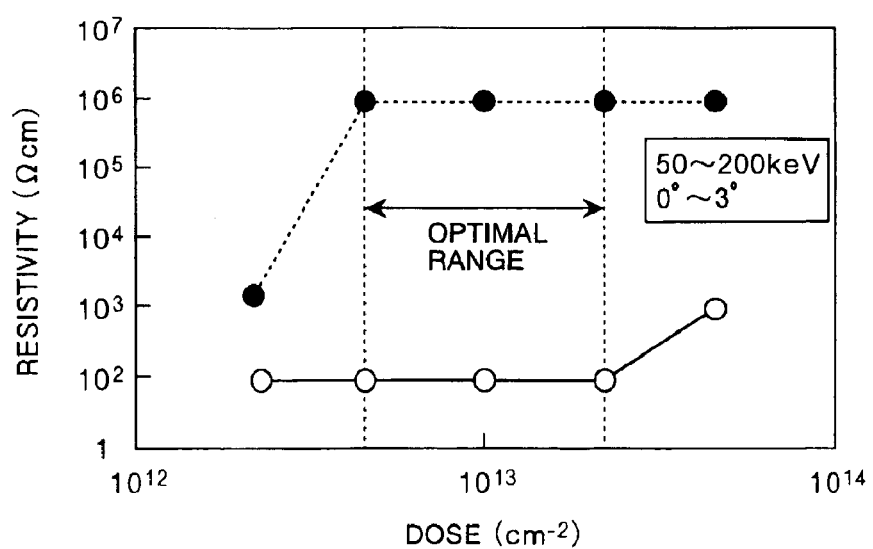
FIG. 4 shows resistivity characteristic graphs of p-type InGaAs (white circles) and n-type InAlAs (black circles) depending on the dose of implanted ions.

However, we attempted to implant the He ions into an InGaAs layer, while changing the energy for implantation from 50 keV to 200 keV which is the upper limit for normal mass production equipment (the incident angle changing among 0, 3, 5 and 7 degrees relative to the vertical to the surface). As a result, the InGaAs became to have higher resistance when He ion implantation was performed at angles of 5 and 7 degrees. However, the results of He ion implantation performed at angles of 0 and 3 degrees showed that, if the dose of the implanted ions is less than $2 \times 10^{13}$ $cm^{-2}$, the resistivity of the p-type InGaAs (the mole fraction of InAs is 0.5 and the concentration of C (carbon) is $2 \times 10^{19}$ $cm^{-3}$) does not change, not subject to the energy for implantation and the incident angle, as shown in FIG. 4. The conduction-type of the p-type InGaAs layer does not change, either.

At the same time, for the InAlAs emitter layer (the mole fraction of InAs is 0.5 and the concentration of Si is $1 \times 10^{17}$ $cm^{-3}$) into which the He ions passing through the InGaAs external base layer are implanted, it was found that InAlAs converts to a highly resistive material with resistivity of about 1 MΩcm, not subject to the energy for implantation and the incident angle, if the dose of the implanted ions is more than $5 \times 10^{12}$ $cm^{-2}$, as shown in FIG. 4. This is due to that the He ions channeled across the InGaAs external base layer have scattered when entered the InAlGaAs external emitter layer and generated crystal defects. In FIG. 4, the resistivity of p-type InGaAs that fills the external base regions is plotted as white circles and the resistivity of n-type InAlAs that fills the external emitter regions is plotted as black circles.

We also conducted ion implantation experiments, using H (hydrogen) and B (boron) ions, besides He. The H ions combined with C (carbon) that is impurities in the p-type InGaAs layer and thereby generated compound defects which resulted in a problem with the reliability of HBT conductivity. Even when the B ions were implanted into the InGaAs external base layer from a direction vertical to the surface of the layer, effective channeling did not take place and the problem of change of the p-type InGaAs to n-type arose. From the results of the experiments, we determined that He ions are optimum as the type of the ions to be implanted in manufacturing InGaAs-base C-top HBTs.

Figure 2:
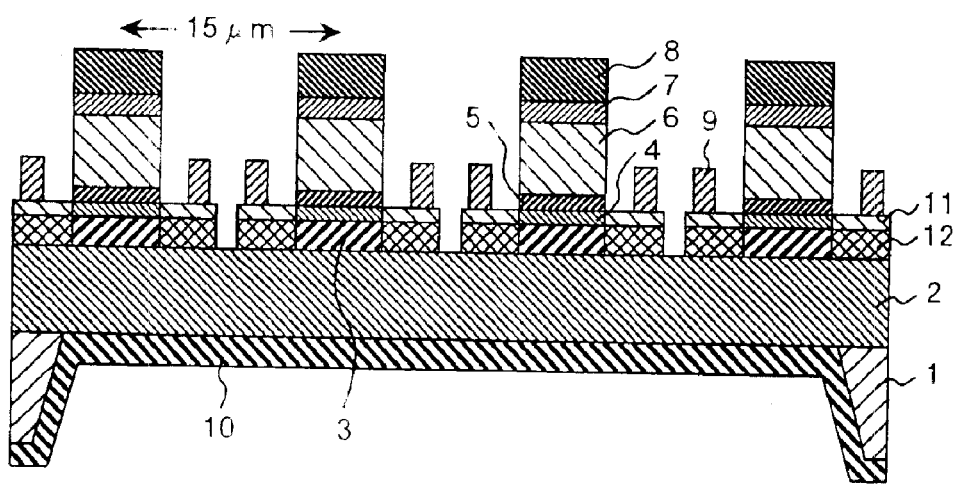
FIG. 2 is a cross-sectional view of multi-finger type, InGaAs-base C-top HBTs to which a method of manufacturing semiconductor devices according to the present invention is applied.

Now, an example of the method of manufacturing semiconductors in accordance with a preferred embodiment of the invention will be described below. FIG. 2 is a cross-sectional view of InGaAs-base C-top HBTs to which the method of manufacturing semiconductor devices according to the present invention is applied. To obtain higher output, the HBTs are constructed in the multi-figure configuration in which multiple fingers are arranged in parallel.

The InGaAs-base C-top HBTs shown in FIG. 2 are fabricated on a semi-insulating InP substrate as a semiconductor substrate 1. On the semiconductor substrate, a high doped n-type InGaAs sub-emitter layer 2 is formed. Each HBT finger comprises a n-type InAlAs emitter layer 3, p-type InGaAs base layer 4, undoped InAlGaAs spacer layer 5, n-type InP collector layer 6, and n-type InGaAs cap layer 7. Moreover, a collector electrode 8 and base electrodes 9 of each HBT are formed on the top of the surface and an emitter electrode 10 covers the bottom surface. The undoped InAlGaAs spacer layer 5 is inserted to avoid the decrease in current gain due to discontinuity of conductive bands between the base layer 4 and the collector layer 6. External base 11 and external emitter 12 layers include He by using the method of manufacturing semiconductor devices of the present invention. Moreover, an opening for heat dissipation which also makes a ground plane is provided directly under the substrate of the transistors, so that heat generated during the operation of the transistors will dissipate to under the substrate.

Figure 1:
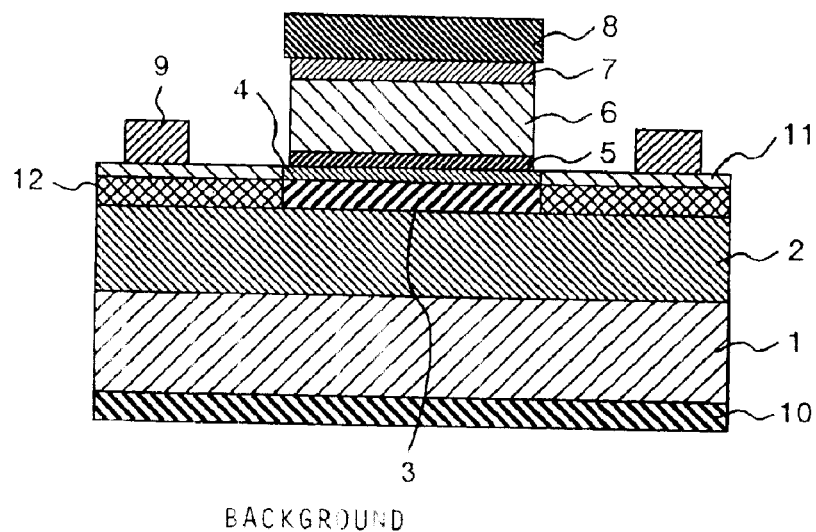
FIG. 1 is a cross-sectional view of a C-top HBT, which illustrates a basic C-top HBT configuration.

A method of fabricating the InGaAs-base C-top HBTs having the above-described configuration, which we applied, will now be described, referring to FIGS. 5 and 6. If a single finger HBT as shown in FIG. 1 is preferred, only a process step of isolating individual fingers should not be performed.

Using an Organometallic Vapor Phase Epitaxy method, we first make the following layers epitaxially grow on the semi-insulating InP substrate in sequence: the high doped n-type InGaAs sub-emitter layer 2 (the concentration of Si is $2\times10^{19}$ cm$^{-3}$ and the layer thickness is 0.8 $\mu$m), the n-type InAlAs emitter layer 3 (the mole fraction of InAs is 0.5, the concentration of Si is $2\times10^{17}$ cm$^{-3}$ and the layer thickness is 0.2 $\mu$m), the p-type InGaAs base layer 4 (the mole fraction of InAs is 0.5, the concentration of C is $2\times10^{19}$ cm$^{-3}$ and the layer thickness is 70 nm), the undoped InAlGaAs spacer layer 5 (the mole fraction of InAs is 0.5, the mole fraction of AlAs and the mole fraction of GaAs are any gradually varying values, and the layer thickness is 20 nm), the n-type InP collector layer 6 (the mole fraction of InP is 0.5, the concentration of Si is $3\times10^{16}$ cm$^{-3}$ and the layer thickness is 0.8 $\mu$m), and the n-type InGaAs cap layer 7 (the mole fraction of InAs is 0.5, the concentration of Si is $2\times10^{19}$ cm$^{-3}$ and the layer thickness is 0.2 $\mu$m).

Using a high-frequency sputter method, we then deposited WSi (the mole fraction of Si is 0.3 and the layer thickness is 0.3 $\mu$m) on the entire surface of the wafer and formed the collector electrodes 8 by photolithography and dry etching using CF$_4$.

Figure 5:
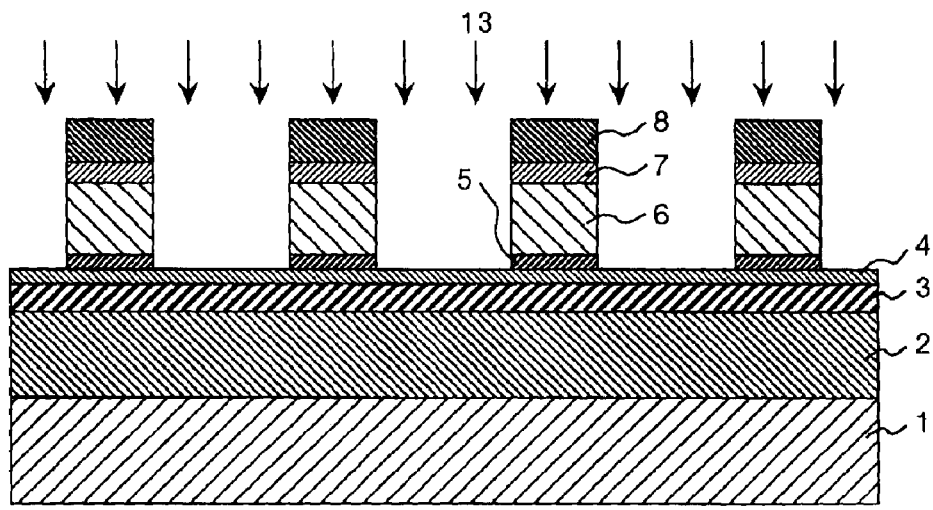
FIG. 5 is a cross section diagram of a configuration of InGaAs-base C-top HBTs into which helium ions are implanted, according to a preferred Embodiment 1 of the method of manufacturing semiconductor devices of the present invention.

Using the collector electrodes 8 as masks, we removed unmasked portions of the n-type InGaAs cap layer 7, n-type InP collector layer 6, and undoped InAlGaAs spacer layer 5 by chlorine plasma etching, so that the p-type InGaAs base layer 4 was exposed as shown in a cross section diagram of FIG. 5.

Then, we implanted He ions 13 into the base and emitter layers under the entire surface under the following conditions: acceleration energy is 50 keV, an incident angle of 90 degrees, the dose of the implanted ions is $1\times10^{13}$ cm$^{-2}$ and at room temperature. As a result, the p-type InGaAs external base regions 11 remained conductive and being p-type and its resistivity did not change. The n-type InAlAs external emitter regions 12 became highly resistive with resistivity increased up to 1 M$\Omega$cm, as shown in FIG. 4.

Then, we formed the base electrodes 9, each consisting of laminated films of Ti (50-nm thick)/Pt (50-nm thick)/Au (200-nm thick), by a lift-off method using electron beam evaporation. The Ti/Pt/Au description indicates a structure in which the Ti, Pt, and Au films are laminated with the Ti film at the bottom and the Au film at the top. Even if films of other substances are used, the structure of the laminates can be described in the same way.

Figure 6:
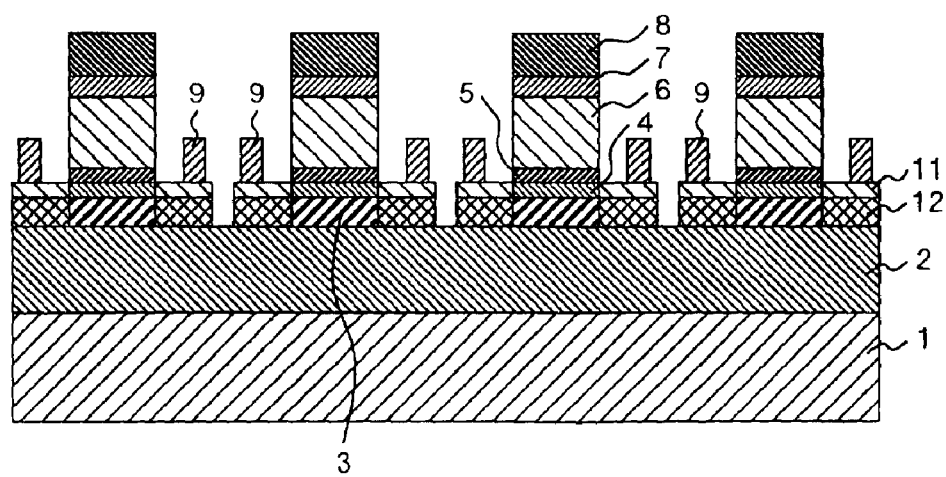
FIG. 6 is a cross section diagram of the above HBTs for explaining process steps following the process of forming the layer structures of the HBTs of FIG. 5.

Next, we removed the portions of the p-type InGaAs external regions 11 and highly resistive InAlAs external emitter regions 12 between two adjacent base electrodes by photolithography and wet etching using a mixed solution of phosphoric acid, hydrogen peroxide, and water, as shown in FIG. 6, so that the n-type InGaAs sub-emitter layer 2 was exposed. Thereby, the individual fingers are isolated.

Then, wiring on the surface (not shown) was performed. After the surface was bonded to a glass substrate, the semi-insulating InP substrate 1 was thinned down to 80 $\mu$m by Mechanical Chemical Polishing (MCP).

Thereafter, we formed an opening for heat dissipation and emitter electrode contact under the row of HBT fingers by photolithography and chlorine plasma etching. We deposited AuGe (60-nm thick)/Ni (10-nm thick)/Au (300-nm thick) and alloyed them for ten minutes in a nitrogen atmosphere at 350° C., thereby forming the emitter electrode 10 consisting of the above substances.

Finally, we separated the semi-isolating InP substrate 1 from the glass substrate and completed the InGaAs-base C-top HBTs shown in FIG. 2.

According to the present embodiment, the He ions implanted are allowed to channel across the external base regions, but not allowed to do in the external emitter regions. In consequence, the low-resistive external base and high-resistive external emitter can be made. An advantage of this method is that InGaAs-base C-top HBTs having good characteristics can be manufactured at low cost.

For the InGaAs-base C-top HBTs fabricated by the manufacturing method described in the present embodiment, specifically, their frequency cutoff characteristic $f_T$ of emitter grounding is about 80 GHz. In contrast with the corresponding characteristic of 40 GHz for conventional E-top GaAs-base HBTs, the InGaAs-base C-top HBTs fabricated according to the present invention have significantly better high-frequency characteristics. Even if the InP substrate which is more expensive than the GaAs substrate is employed, the InGaAs-base C-top HBTs can be manufactured at as low cost as for manufacturing the E-top GaAs-base HBTs, because the pitches between the multi-fingers can be reduced to one third the pitches for the E-top GaAs-base HBTs.

The energy, incident angle and dose for implantation of He ions, mentioned in the present embodiment, are example values and, of course, even with other values of these parameters within their ranges described in FIG. 4, it is possible to make the external base regions low resistive and the external emitter regions high resistive.

Embodiment

A monolithic microwave integrated circuit (hereinafter referred to as MMIC) for power amplifier use, which includes the C-top InGaAs-base HBTs fabricated by the above-described method of manufacturing semiconductor devices of the present invention, will now be described, referring to FIG. 7.

Figure 7:
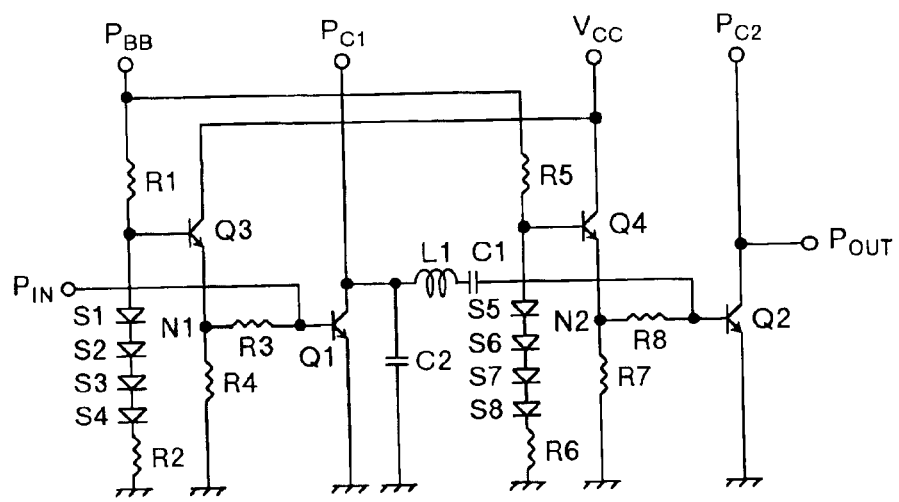
FIG. 7 is a circuit diagram of a MMIC for power amplifier use including the C-top InGaAs-base HBTs fabricated by the method of manufacturing semiconductor devices of the present invention.

FIG. 7 is a circuit diagram of the MMIC for power amplifier use which is configured in two stages (may be configured in three or more stages). A signal input to an input pad electrode $P_{IN}$ is input to the base of an amplifying transistor Q1 in the forward stage. The signal amplified by the transistor Q1 is passed through an impedance matching circuit which is comprised of a capacitor C2, an inductor L1, and a capacitor C1 connected to the collector of the transistor Q1 and input to the base of an amplifying transistor Q2 in the output stage. The output signal amplified by the transistor Q2 is output through an output pad electrode $P_{OUT}$.

The amplifying transistors Q1 and Q2 are respectively provided with pad electrodes $P_{C1}$ and $P_{C2}$ which function as collector bias terminals so that the collector bias of these transistors can be adjusted externally. The base bias of the amplifying transistors Q1 and Q2 can also be adjusted externally through bias adjusting transistors Q3 and Q4 whose collectors are connected to a supply voltage $V_{cc}$. The emitter of the transistor Q3 is connected to a connection node N1 at which bias resistors R3 and R4 are connected and its base is connected to a base bias pad electrode $P_{BB}$ via a resistor R1. The emitter of the transistor Q4 is connected to a connection node N2 at which bias resistors R7 and R8 are connected and its base is connected to the base bias pad electrode $P_{BB}$ via a resistor R5. A voltage applied to the base bias pad electrode $P_{BB}$ is divided by the resistor R1, a sequence of diodes S1 to S4, and a resistor R2 which are connected in series between the pad electrode $P_{BB}$ and the ground and the thus divided voltage is applied to the base bias of the transistor Q3. Similarly, the voltage applied to the base bias pad electrode $P_{BB}$ is divided by the resistor R5, a sequence of diodes S5 to S8, and a resistor R6 which are connected in series between the pad electrode $P_{BB}$ and the ground and the thus divided voltage is applied to the base bias of the transistor Q4.

In the present embodiment, the MMIC was fabricated by installing at least the following on the semi-insulating InP substrate: the circuit components constituting a power amplifier shown in FIG. 7, namely, all of the transistors Q1 to Q4, diodes S1 to S8, capacitors C1 and C2, resistors R1 to R8, and inductor L1. As the transistors Q1 and Q4, the InGaAs-base C-top HBTs described in Embodiment 1 are used. The number of HBT fingers may differ for each transistor; transistor structures with more HBT fingers should be used as the amplifying transistors Q1 and Q2 and those with less HBT fingers used as the bias adjusting transistors Q3 and Q4. For the capacitors, Metal-Insulator-Metal (MIM) type capacitors consisting of multiple metal wiring and insulation layers were used. For the inductor, a spiral-patterned metal wiring layer was used. For the resistors, WsiN or NiCr were used. The size of the two-stage amplifier MMIC was 0.5 mm by 0.5 mm. As compared with the MMIC size using conventional InGaAs-base E-top HBTs which was approximately 1 mm by 1 mm, the MMIC size was reduced to about one fourth, in other words, the chip cost was cut down to about one fourth.

According to the present embodiment, thus, an advantage of the invented method is that a MMIC using the InGaAs-base C-top HBTs can be manufactured at cost comparable to the cost of manufacturing a MMIC using GaAs-base HBTs which is now commonly used for a power amplifier of mobile communication equipment.

Embodiment

Figure 8:
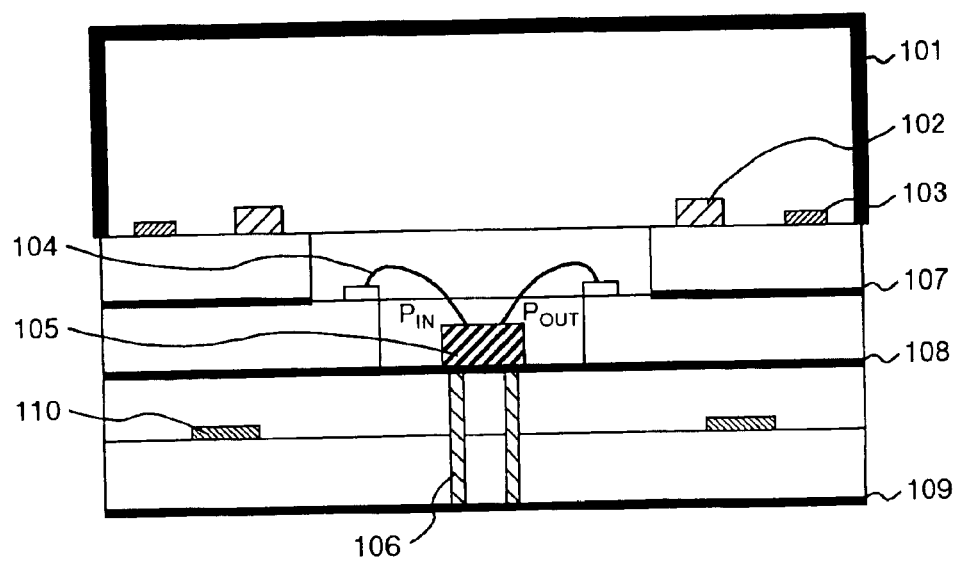
FIG. 8 is a schematic cross section diagram of a power amplifier module for mobile equipment, the module fabricated, using the MMIC for power amplifier use including the C-top InGaAs-base HBTs fabricated by the method of manufacturing semiconductor devices of the present invention.

FIG. 8 is a schematic cross section diagram of a power amplifier module for mobile equipment, the module fabricated, using the MMIC including the InGaAs-base C-top HBTs, described in Embodiment 2. For this module package, a glass ceramic substrate with a relative dielectric constant of 8 is employed, which was produced by low temperature firing. Owing to the reduced MMIC size which is one fourth the size of conventional MMICs, the module size is 4 mm by 4 mm, which is significantly smaller than the corresponding module size of 6 mm by 6 mm achieved by prior art. Reference numeral 101 denotes a metal cap, 102 denotes a chip part including external capacitors, inductors, and resistors. Reference numeral 103 denotes an electric line which is formed by thick film screen print of Ag and PT laminated films. Reference numeral 105 denotes the MMIC of Embodiment 2 and its bottom surface is electrically bonded to a ground layer 108 by Ag paste. The leads of the input electrode pad $P_{IN}$ and output electrode pad $P_{OUT}$ placed on the top surface of the MMIC 105 extend to wire bonds 104 outside the chip. Reference numeral 106 denotes a thermal via for allowing heat to dissipate outside from the bottom of the MMIC and 107 and 109 are ground layers beside the ground layer 108. Reference numeral 110 denotes a bias line for bias voltage supply to the MMIC circuitry.

We evaluated the operation of the power amplifier module of the present embodiment in accordance with a Wideband-Code Division Multiple Access (W-CDMA) method which is standard for the third generation mobile communications. The result showed a greatly enhanced electric power conversion efficiency of 48% in contrast with 41% for prior art modules of the corresponding type.

According to the present embodiment, thus, an advantage of the invented method is that a smaller-volume, high-efficiency power amplifier module for mobile equipment can be produced, using a downsized, low costly MMIC with excellent high-frequency characteristics, produced by Embodiment 2.

As elucidated by the foregoing embodiments, the present invention offers the advantage that semiconductor devices for smaller-size power amplifiers with high electric power conversion efficiency for use in mobile communication equipment can be manufactured at low cost.

While the present invention has been described specifically, based on its preferred embodiments, it will be appreciated that the present invention is not limited to the illustrative embodiments described hereinbefore and may be embodied in other modified forms including various design alterations within the scope of the invention without departing from its spirit.

What is claimed is:

1. A method of manufacturing semiconductor devices, comprising the steps of:

forming an n-type emitter layer, a p-type base layer and an n-type collector layer in sequence on a semiconductor substrate from a surface of the substrate;

depositing a refractory metal over the entire surface of the substrate;

treating the refractory metal into a predetermined shape;

exposing the p-type base layer by using the refractory metal as a mask; and implanting helium ions into the base layer and the emitter layer from a direction vertical to the surface of the semiconductor substrate or within an angle of 3 degrees off the vertical, wherein in implanting helium ions into the base and emitter layers, external base regions of the base layer remain conductive and resistivity thereof does not change, and external emitter regions of the emitter layer have increased resistivity, the external base regions and the external emitter regions being constituted by portions of the base layer and of the emitter layer not positioned beneath the refractory metal having the predetermined shape.

2. A method of manufacturing semiconductor devices according to claim 1, wherein the process of forming the emitter, base and collector layers in sequence on the semiconductor substrate is performed by an Organometallic Vapor Phase Epitaxy method.

3. A method of manufacturing semiconductor devices according to claim 1, wherein said semiconductor substrate is a semi-insulating InP substrate, said emitter layer is made of InAlAs, said base layer is made of InGaAs, and said refractory metal is WSi.

4. A method of manufacturing semiconductor devices according to claim 3, wherein said implantation with helium ions is performed with energy for implantation being set within a range of 50 keV to 200 keV and a dose of the ions to be implanted being set within a range of $5 \times 10^{12}$ cm$^{-2}$ to $2 \times 10^{13}$ cm$^{-2}$.

5. A method of manufacturing semiconductor devices according to claim 1, wherein said implantation with helium ions is performed with energy for implantation being set within a range of 50 keV to 200 keV and a dose of the ions to be implanted being set within a range of $5 \times 10^{12}$ cm$^{-2}$ to $2 \times 10^{13}$ cm$^2$.

6. A method of manufacturing semiconductor devices, comprising the steps of:

forming a highly doped sub-emitter layer, an n-type emitter layer, a p-type base layer, an undoped spacer layer, an n-type collector layer and an n-type cap layer in sequence on a semiconductor substrate from a surface of the semiconductor substrate, by an Organometallic Vapor Phase Epitaxy method;

depositing a refractory metal over the entire surface of the substrate by a high-frequency sputter method;

treating the refractory metal into a predetermined shape;

exposing the p-type base layer by removing unmasked portions of the cap layer, the collector layer and the undoped spacer layer using the refractory metal having the predetermined shape as a mask; and implanting helium ions into the base layer and the emitter layer from a direction vertical to the surface of the semiconductor substrate or within an angle of 3 degrees off the vertical.

7. A method of manufacturing semiconductor devices according to claim 6, wherein said semiconductor substrate is a semi-insulating InP substrate, said sub-emitter layer is made of InGaAs, said emitter layer is made of InAlAs, said base layer is made of InGaAs, said undoped spacer layer is made of undoped InAlGaAs, said collector layer is made of InP, said cap layer is made of InGaAs and said refractory metal is WSi.

8. A method of manufacturing semiconductor devices according to claim 6, wherein in implanting helium ions into the base and emitter layers, external base regions of the base layer remain conductive and resistivity thereof does not change, and external emitter regions of the emitter layer have increased resistivity, the external base regions and the external emitter regions being constituted by portions of the base layer and of the emitter layer not positioned beneath the refractory metal having the predetermined shape.

* * * * *